United States Patent
Chen et al.

(10) Patent No.: US 6,421,794 B1
(45) Date of Patent: Jul. 16, 2002

(54) METHOD AND APPARATUS FOR DIAGNOSING MEMORY USING SELF-TESTING CIRCUITS

(76) Inventors: John T. Chen, 5217 5th Ave., Apt. 3, Pittsburgh, PA (US) 15232; Janusz Rajski, 32095 6502 Horton Rd., West Linn, OR (US) 97068-2847

( * ) Notice: Subject to any disclaimer, the term of this patent is extended or adjusted under 35 U.S.C. 154(b) by 0 days.

(21) Appl. No.: 09/522,279

(22) Filed: Mar. 9, 2000

(51) Int. Cl.$^7$ ................................................ H04L 1/22
(52) U.S. Cl. ........................................ 714/42; 714/733
(58) Field of Search .............................. 714/42, 37, 39, 714/41, 43, 44, 30, 25, 27, 32, 733, 738, 742

(56) References Cited

U.S. PATENT DOCUMENTS

| | | |
|---|---|---|
| 4,061,908 A | 12/1977 | de Jonge et al. |
| 4,228,528 A | 10/1980 | Cenker et al. |
| 5,148,398 A | 9/1992 | Kohno |
| 5,317,573 A * | 5/1994 | Bula et al. ................. 371/10.3 |
| 5,377,148 A | 12/1994 | Rajsuman |
| 5,436,912 A | 7/1995 | Lustig ........................ 371/21.2 |
| 5,467,455 A * | 11/1995 | Gay et al. ................... 395/281 |
| 5,557,619 A * | 9/1996 | Rapoport ................... 371/22.5 |
| 5,644,578 A * | 7/1997 | Ohsawa ..................... 371/21.2 |
| 5,913,928 A * | 6/1999 | Morzano .................... 714/710 |
| 5,923,599 A * | 7/1999 | Hii et al. ..................... 365/201 |
| 5,954,830 A * | 9/1999 | Ternullo, Jr. ................ 714/718 |
| 5,961,653 A * | 10/1999 | Kalter et al. .................. 714/7 |
| 6,067,262 A * | 5/2000 | Irrinki et al. ................ 365/201 |
| 6,134,684 A * | 10/2000 | Baumgartner et al. ....... 714/724 |
| 6,167,481 A * | 12/2000 | Ban ............................... 711/1 |
| 6,205,559 B1 * | 3/2001 | Sakaguchi ..................... 714/25 |
| 6,272,588 B1 * | 8/2001 | Johnston et al. ............. 711/106 |

FOREIGN PATENT DOCUMENTS

| | | |
|---|---|---|
| EP | 0 599 524 A2 | 6/1994 |
| WO | 98/20497 | 5/1998 |

OTHER PUBLICATIONS

Schanstra, et al., "Semiconductor Manufacturing Process Monitoring using Built–In Self–Test for Embedded Memories," Delft University of Technology—Department of Electrical Engineering, Delft—The Netherlands.

Naik, et al., "Failure Analysis of High–Density CMOS SRAMSs Using Realistic Defect Modeling and $I_{DDQ}$ Testing," IEEE Design & Test of Computers, Jun. 1993, pp. 13–23.

* cited by examiner

Primary Examiner—Nadeem Iqbal
(74) Attorney, Agent, or Firm—Blakely Sokoloff Taylor & Zafman LLP

(57) ABSTRACT

A method and apparatus for diagnosing memory using self—testing circuits. A comparator compares actual data output from a RAM with expected output generated by built—in self—testing (BIST) circuitry. The comparator outputs a resulting initial fail vector which is subsequently input into a compressor. The compressor performs multiple logical operations on the initial fail vector to compress or reduce the bit—width of the initial fail vector, resulting in a compressed fail vector. Once generated, the compressed fail vector is fed to I/O terminals of the integrated circuit (IC) forming a stream of bits to be recorded by test equipment external to the IC. The recorded compressed fail vector is then utilized to reconstruct the initial fail vector that was generated by the bit comparator.

26 Claims, 13 Drawing Sheets a. | x | x | 1 | x |  → AND=1 →  | 1 | 1 | 1 | 1 | b. | 1 | 1 | 1 | x |  → AND=0 →  | 1 | 1 | 1 | 0 | c. | x | x | x | x |  → OR=0 →  | 0 | 0 | 0 | 0 | d. | 0 | 0 | 0 | x |  → OR=1 →  | 0 | 0 | 0 | 1 | e. | 1 | x | x | x |  → 2OR=0 →  | 1 | 0 | 0 | 0 | f. | 1 | 0 | 0 | x |  → 2OR=1 →  | 1 | 0 | 0 | 1 | g. { | 1 | 1 | x | x | / | x | x | x | 0 | }  → RE=1 →  { | 1 | 1 | x | 0 | / | 1 | 1 | x | 0 | } h. { | 1 | 1 | 0 | 0 | / | 1 | 1 | x | 0 | }  → RE=0 →  { | 1 | 1 | 0 | 0 | / | 1 | 1 | 1 | 0 | } i. | 1 | 0 | 1 | x |  → XOR=1 →  | 1 | 0 | 1 | 1 |

FIG. 12

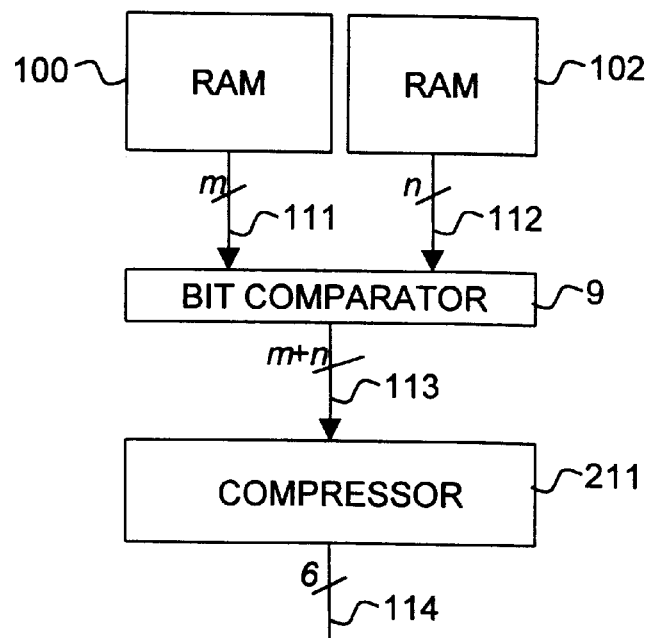
FIG. 15
FIG. 16
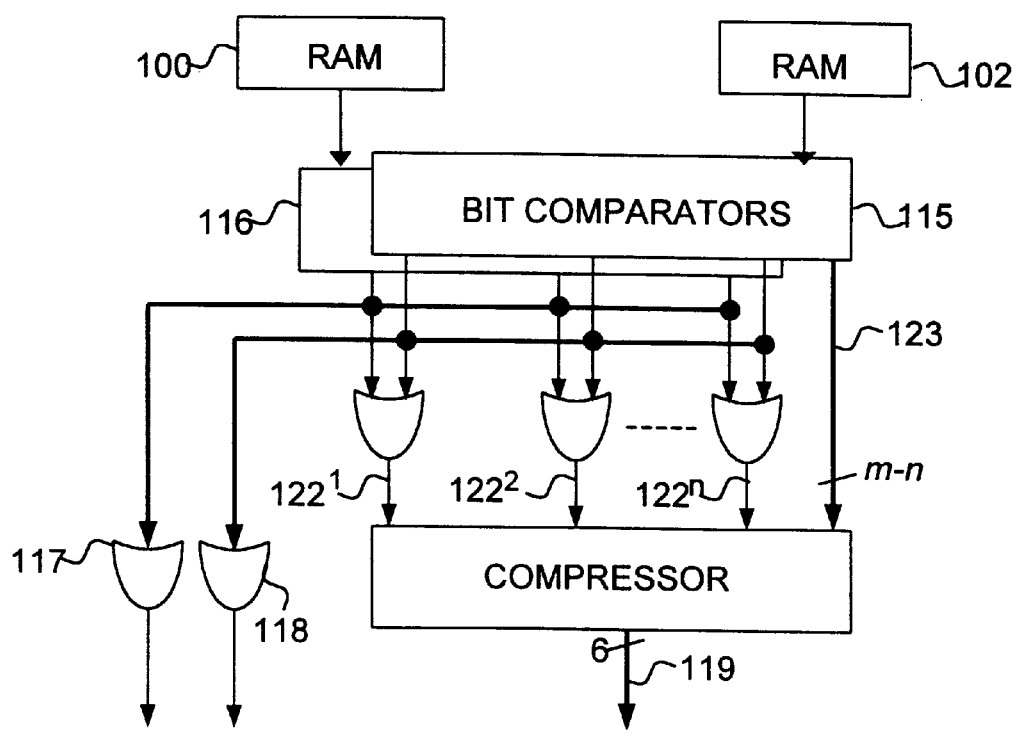

METHOD AND APPARATUS FOR DIAGNOSING MEMORY USING SELF-TESTING CIRCUITS

BACKGROUND OF THE INVENTION

1. Field of the Invention

The present invention relates to the testing of embedded memory devices. More specifically, the present invention relates to a method and apparatus for diagnosing memory devices using self—testing circuits.

2. Background Information

Random access memory (RAM) devices are often tested by determining whether a value written to and a value later read from the same address space of the RAM match for all addresses specified within a predetermined test sequence. Various test sequences, or test algorithms, are known in the art including, for example, those defined in U.S. Pat. Nos. 4,061,908 and 5,377,148. A memory device is considered to be fault—free if, at the completion of a test, no value mismatches are found. If mismatches are found, however, additional information regarding the location and behavior of the one or more faulty cells may be desirable for several purposes. First, given the locations of the faulty cells, the RAM may be repaired by replacing the faulty cells with spare memory cells as described in U.S. Pat. No. 4,228,528. Additionally, the location and behavior of the one or more faulty cells may be mapped to physical defects to help pinpoint the cause of yield loss, as reported by S. Naik et al. in "Failure Analysis of High Density CMOS SRAMs", published in the IEEE Design & Test of Computers, pg. 13–23, June 1993.

RAM that is incorporated inside logic circuits, as opposed to discrete stand-alone RAM, is often referred to as embedded memory. Embedded memories are more difficult to test through external means because their input and output terminals are usually directly connected to logic circuitry instead of being connected to input/output (I/O) terminals of the integrated circuit (IC). One mechanism used to facilitate embedded memory testing is known as a built-in self-test (BIST) circuit. BIST circuits are built into ICs to generate input vectors and analyze output data in response to the generated input vectors.

FIG. 1 illustrates a random access memory (RAM) device including built-in self-test (BIST) circuitry according to the prior art. Referring to FIG. 1, the BIST circuitry 2 is configured to test a RAM 1 containing a variable number of data blocks. During test execution, the BIST circuitry 2 generates input vectors which are input into RAM 1 through various input terminals including address input terminals 3, data input terminals 4, write enable terminal 5, and chip enable terminal 6. A bit comparator 9 is used to compare the data output 7 from the RAM 1, with the expected data output 8 generated by the BIST circuitry 2. A resulting initial fail vector 10, including data indicating whether a memory failure occurred, is output by the bit comparator 9 to I/O terminals 20. A value of "1" contained within any bit of the fail vector is referred to as a fail bit and indicates that the corresponding bit of data output does not match the expected value and therefore, may be faulty.

The bit-width, m, of the fail vector 10 is often larger than the number of output pins available on the IC. Thus, outputting the entire fail vector directly to I/O terminals, such as I/O terminals 20, is often difficult. Conventional fail vector analyses, observe the result of a logical "OR" operation performed on the fail vector as a whole to merely detect whether any one or more bits of the data output is faulty. In order to repair faulty cells or analyze yield loss, however, the locations and behavior of the defective cells may need to be diagnosed, thereby requiring a more detailed observation of the fail vector than such conventional methods provide.

Several methodologies exist that attempt to address the problem of analyzing a large fail vector on an IC containing a relatively small number of I/O pads. First, additional I/O pads may be added to the IC to compensate for the large fail vector. This practice, however, often results in a substantial increase in circuit area and renders the IC diagnosable only before packaging. Another existing method used to analyze a large fail vector is to execute the relevant test m times (where m represents the bit-width of the fail vector), and during each test execution, one bit of the fail vector is multiplexed to the output pin. This method, however, multiplies the test duration by the bit-width of the fail vector. Another technique, disclosed in U.S. Pat. No. 5,148,398, halts test execution upon detecting a data mismatch to sequentially scan data and address information out of the chip. The interruption of test execution to scan out such information extends the time required for testing indefinitely, depending upon the number of faults encountered and the amount of data to be scanned out. Yet another technique has been reported by I. Schanstra et al. in a paper entitled "Semiconductor Manufacturing Process Monitoring Using Built-In Self-Test for Embedded Memories" published in the Proceedings of International Test Conference, Oct. 18–23, 1998. This technique recognizes faulty columns and faulty cells during testing and records their addresses and fail vectors in registers. At the end of the test, the data in the registers is serially outputted to the I/O terminals. This technique, however, is only effective at reporting the location of just a limited number of faulty cells. Furthermore, no information is provided to show whether the cell failed at reading a value of "1" or "0", and the technique can only be used with limited test algorithms.

Thus, there is a need for a method and apparatus to diagnose failing location and behavior of RAM without significant increase in the IC area or test time.

SUMMARY OF THE INVENTION

In accordance with one aspect of the present invention, test data is generated and applied to an embedded memory. Actual data output from the embedded memory in response to the application of the test data is compared with expected responsive outputs to form a plurality of initial fail vectors. The initial fail vectors are compressed to form compressed fail vectors by performing a plurality of logical operations on groups of elements of a fail matrix logically formed from the initial fail vectors.

In accordance with another aspect of the present invention, a plurality of compressed fail vectors is received in which each of the plurality of compressed fail vectors comprises a plurality of representations formed in accordance with results of logical operations performed on logically grouped elements of a fail matrix which were formed from a plurality of initial fail vectors. The initial fail vectors are recovered from the compressed fail vectors by successively ascertaining values of the data elements of the fail matrix. The values are ascertained by successively examining the representations formed in accordance with the results of the logical operations and applying a plurality of determination rules specifying assignment values for the data elements of the fail matrix in accordance with at least the results of the logical operations.

In accordance with yet another aspect of the present invention, a computer system is programmed with software code to enable the computing device to receive a plurality of compressed fail vectors and to recover a plurality of initial fail vectors therefrom. The initial fail vectors are recovered by successively examining representations formed in accordance with results of logical operations performed on logically grouped elements of a fail matrix and applying a plurality of determination rules specifying assignment values for the elements of the fail matrix in accordance with at least the results of the logical operations.

In accordance with yet another aspect of the present invention, an integrated circuit comprises a comparator to logically generate a sequence of comparison outputs, a plurality of logical operation circuits, and a plurality of couplings to couple a plurality of combinations of data elements of the sequence of comparison outputs to the logical operation circuits. Such coupling enables a plurality of logical operations to be performed on the combinations of data elements to compress the comparison outputs.

BRIEF DESCRIPTION OF THE DRAWINGS

The present invention will be more fully understood from the detailed description given below and from the accompanying drawings of various embodiments of the invention, which, however, should not be taken to limit the invention to the specific embodiments, but are for explanation and understanding only.

FIG. 12 illustrates various determination rules used to recreate an initial fail matrix from a compressed fail matrix according to one embodiment of the present invention.

FIG. 15 is a block diagram illustrating a compressor connected to parallel memories according to one embodiment of the present invention.

FIG. 16 is a block diagram illustrating the use of superimposition to connect two bit comparators to a single compressor according to one embodiment of the present invention.

DETAILED DESCRIPTION

Figure 1:
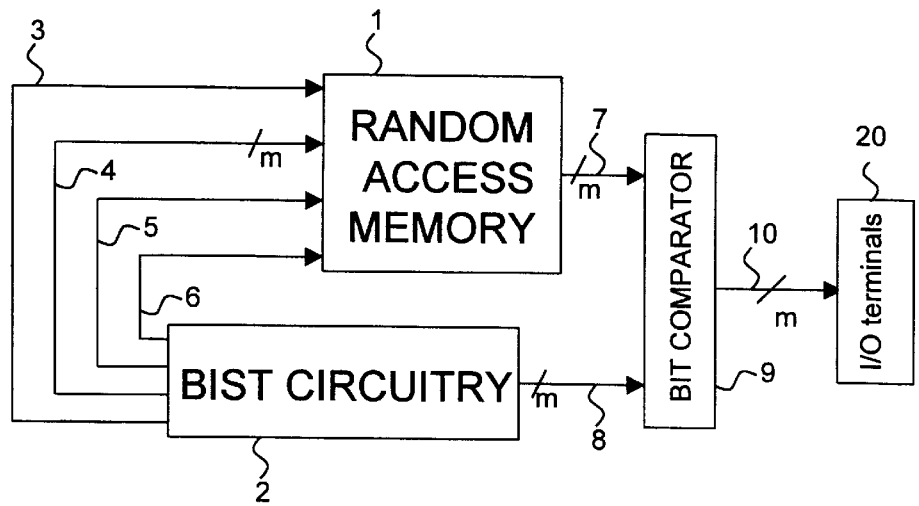
FIG. 1 illustrates a random access memory (RAM) device including built-in self-test (BIST) circuitry according to the prior art.

A method and apparatus for diagnosing memory using self-testing circuits is disclosed. In the following description, for purposes of explanation, numerous specific details are set forth in order to provide a thorough understanding of the present invention. It will be apparent, however to one skilled in the art that the present invention can be practiced without these specific details. In other instances, well-known structures and devices are shown in block diagram form to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for the reasons of common usage, to refer to these signals as bits, values, elements, inputs, outputs, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "performing" or "determining" or "executing" or the like, refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMS, magneto-optical disks, read-only memories (ROMs), random access memories (RAMs), EPROMs, EEPROMs, magnetic or optical cards, or any type of media suitable for storing electronic instructions, and each coupled to a computer system bus. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, although the present invention may be described with reference to a particular programming language, it will be appreciated that a variety of programming languages may be used to implement the teachings of the invention as described herein.

Although all or some of the operations may be performed by software executing on one or more processing devices (e.g., CPUs), on a computer system or specialized apparatus, some or all of these operations may be performed by digital logic and/or circuitry, an integrated circuit (e.g., ASIC) or other semiconductor substrates.

Reference in the specification to "one embodiment" or "an embodiment" means that a particular feature, structure, or characteristic described in connection with the embodiment is included in at least one embodiment of the invention. The appearances ::IO of the phrase "in one embodiment" in various places in the specification are not necessarily all referring to the same embodiment.

OVERVIEW

Figure 2:
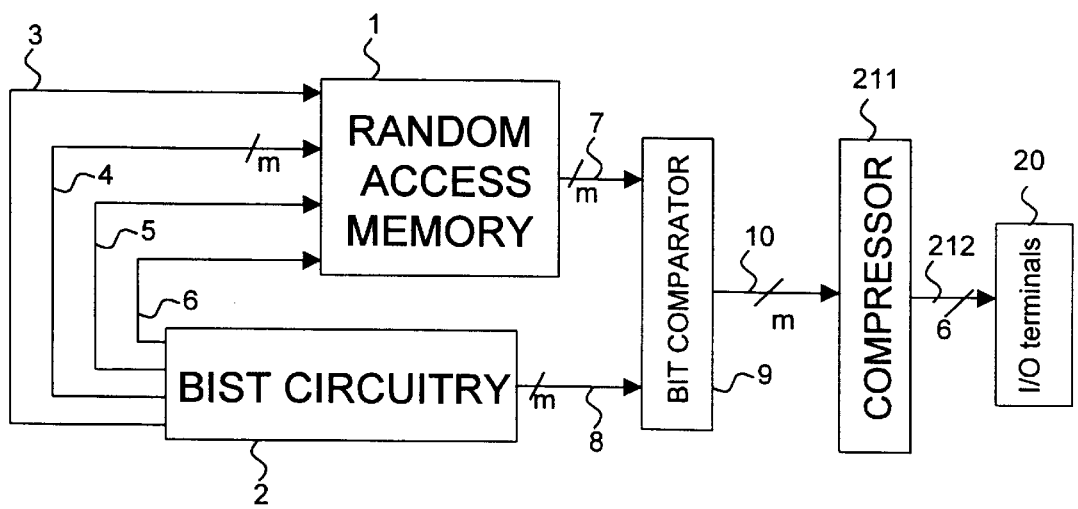
FIG. 2 illustrates the RAM device and BIST circuitry of the prior art, along with a compressor according to one embodiment of the present invention.

FIG. 2 illustrates an IC comprising the conventional RAM device and BIST circuitry depicted in FIG. 1, along with a compressor 211 according to one embodiment of the present invention. Referring to FIG. 2, a bit comparator 9 compares data output 7 from the RAM 1 with the expected data output 8 generated by the BIST circuitry 2. The bit comparator 9 outputs a resulting initial fail vector 10 which is subsequently input into a compressor 211. The compressor 211 performs multiple logical operations on the initial fail vector 10 to compress or reduce the bit-width of the initial fail vector 10, resulting in a compressed fail vector 212. In one embodiment, for each initial fail vector 10 input into the compressor 211, the compressor 211 generates a six-bit compressed fail vector 212. Once generated, the compressed fail vector 212 is fed to the I/O terminals 20 of the IC to be recorded by test equipment external to the IC. The recorded compressed fail vector is then utilized to reconstruct the initial fail vector 10 originally generated by the bit comparator 9. In one embodiment, a plurality of instructions are executed by a processor to reconstruct the original fail vector 10 given the compressed fail vector 212.

The compressor 211 has various modes of operation, including a reset mode, a read mode, a hold mode, a flush mode, and a signal mode, all of which are controlled by the BIST circuitry 2. The reset mode resets the registers in the compressor 211, and is typically invoked before the execution of each test. In one embodiment, the signal to activate the reset mode is tied to the reset line of the BIST circuit 2.

When the BIST circuit 2 reads a value from the RAM 1 and generates an initial fail vector 10, the read mode of the compressor 211 is activated to allow the compressor 211 to read in the initial fail vector 10. During clock cycles in which the BIST circuit 2 is not reading any value from the RAM 1, the hold mode is used to pause the counter internal to the compressor 211 thereby preventing registers from updating their values.

At the end of the test, values typically remain in the registers of the unique XOR modules and column segment modules. The flush mode of compressor 211 functions to scan out the remaining values in the registers to the I/O terminals 20. The flush mode scans the remaining values of the registers to a location off of the chip while blocking data input from the bit-comparator 9 so as to prevent changes to existing values in the registers. The flush mode may further be used to reset the value of registers, thus eliminating the need for an explicit reset mode.

Finally, like the hold mode, the signal mode can be entered when the BIST circuitry is not reading a value from the RAM. In one embodiment, the signal mode takes advantage of unused output combinations (discussed below in greater detail) of the AND and OR functions of column segments, in which the AND function results in a 0 and the OR function results in a 1. Such unused output combinations may be used within the signal mode to signal various aspects of the test status, such as test progress for example.

Fail Vector Compression

In one embodiment of the present invention, the compressed fail vector 212 is obtained by way of the compressor 211 performing a series of logical operations upon various groups of data designated within a fail matrix. For the purposes of this disclosure, a fail matrix comprises a series of consecutively-combined fail vectors with each fail vector forming a row of the fail matrix. Elements of a fail matrix can be logically partitioned into at least three types of groups including, groups of elements that comprise a single row of the fail matrix ("row groups"), groups of elements that comprise a single column of the fail matrix ("column segment groups"), and groups of elements belonging to both a consecutive row and a unique column of the fail matrix ("unique groups"). In one embodiment, a unique group of elements may be exemplified by a diagonal grouping, whereas in another embodiment, a unique group of elements may be determined using the equation "row=(i* col) mod m" (described below).

In one embodiment, logical "OR", "AND", and two-or-more ("2OR") operations are performed on each row group contained within the fail matrix with the combined results of the operations being encoded into one 2-bit representation per row group. The logical "OR" operation determines whether any 1s exist within the specified group, the logical "AND" operation determines whether only 1s exist within the specified group, and the "2OR" operation determines whether two or more 1s exist within the specified group of the fail matrix. As with each row group, the logical "OR" and "AND" operations are similarly applied to each column segment group in the fail matrix. In place of the 2OR operation, however, a repeat operation (RE) is applied to each column segment group to determine whether the elements within a specified column segment group are identical to an adjacent column segment group. In one embodiment, an adjacent column segment group refers to a group of elements located immediately to the left of the elements of the specified column segment group. In one embodiment, the results of the column segment group operations are not encoded and thereby result in three, rather than two bits of data for each column segment group operated on. In other embodiments, however, the results of the column segment group operations may be encoded. Lastly, an exclusive OR ("XOR") operation is performed upon each unique group contained within the fail matrix. The XOR operation determines of a single 1 exists within the specified group of the fail matrix, and results in one bit of data per unique group. In one embodiment, when the resulting bit representations for each row group (i.e. two encoded bits), column segment group (i.e. three non-encoded bits), and unique group (one non-encoded bit) are combined, a compressed fail vector having a length of 6-bits (e.g. 2+3+1) is formed.

The output signals of the three logical operations performed on each row group create four possible result scenarios as shown in FIG. 3a. FIG. 3a illustrates a 4-bit wide fail matrix 300 showing binary elements grouped by rows. The fail matrix 300 is shown containing four row groups 305, each of which is designated by a dotted oval. Additionally, FIG. 3a shows a results table 301 that contains binary results of various logical operations performed on the elements contained within each row group 305.

In the first scenario 302, each of the AND, OR, and 2OR operations as applied to the first row group resulted in a zero.

That is to say, when applied to the first row group of the fail matrix 300, the logical "OR" operation resulted in a zero (OR=0) indicating that no 1s were present in that group; the logical "AND" operation resulted in a zero (AND=0) indicating that not all (if any) of the elements in the first row group were 1s; and the logical "2OR" likewise operation resulted in a zero (2OR=0) indicating that less than two 1s were present in the first row group. In the second scenario 304, the indicated row group (in this case the second row group) contained exactly one 1 (OR=1, 2OR=0, AND=0), while in the third scenario 306, the indicated row group contained two or more, but less than m 1s (OR=1, 2OR=1, AND=0), where m represents the bit-width of the fail matrix. Lastly, in the fourth scenario 308, the indicated row group contained all 1s (OR=1, 2OR=1, AND=1). In one embodiment, each of the four result scenarios are encoded into a two-bit representation, to form part of the 6-bit compressed fail vector 212.

In addition to row groups, the fail matrix may also be divided into non-overlapping vertical column segment groups, each containing m consecutive elements where m is equal to the bit-width of the fail matrix. FIG. 3b illustrates a 4-bit wide fail matrix (e.g. m=4) showing column segment groups each enclosed by a dotted oval. In one embodiment, an AND operation 312 and an OR operation 314 are applied to each column segment group resulting in an additional two bits of the 6-bit compressed fail vector 212. In addition to the AND and OR operations (312 and 314 respectively), a repeat operation (RE) 316 is applied to each column segment group to determine whether its contents are identical to an adjacent column segment group. In one embodiment, an adjacent column segment group refers to the m elements immediately to the left of the m elements of a given column segment group. The column segment groups that are in the leftmost column have adjacent segment groups in the rightmost column of the fail matrix. In one embodiment, when a row of all 0s is detected (by the row group OR operation), all the elements of this row are masked as 1s for the AND operations of the column segment groups that cross this row. Due to this, the AND result 318 of column segment group 311 in FIG. 3b is equal to 1 because the rows 322 to which the first three elements of column segment group 311 belong are masked as rows of all 1s. Conversely, when a row of all 1s is detected (by the row group AND operation), all the elements of this row are masked as 0s for the OR operations of column segment groups that cross this row. Thus, the OR result 320 of the column segment group 311 is a 0 rather than a 1, because the bottom row 324 is masked as a row of all 0s.

Figure 3:
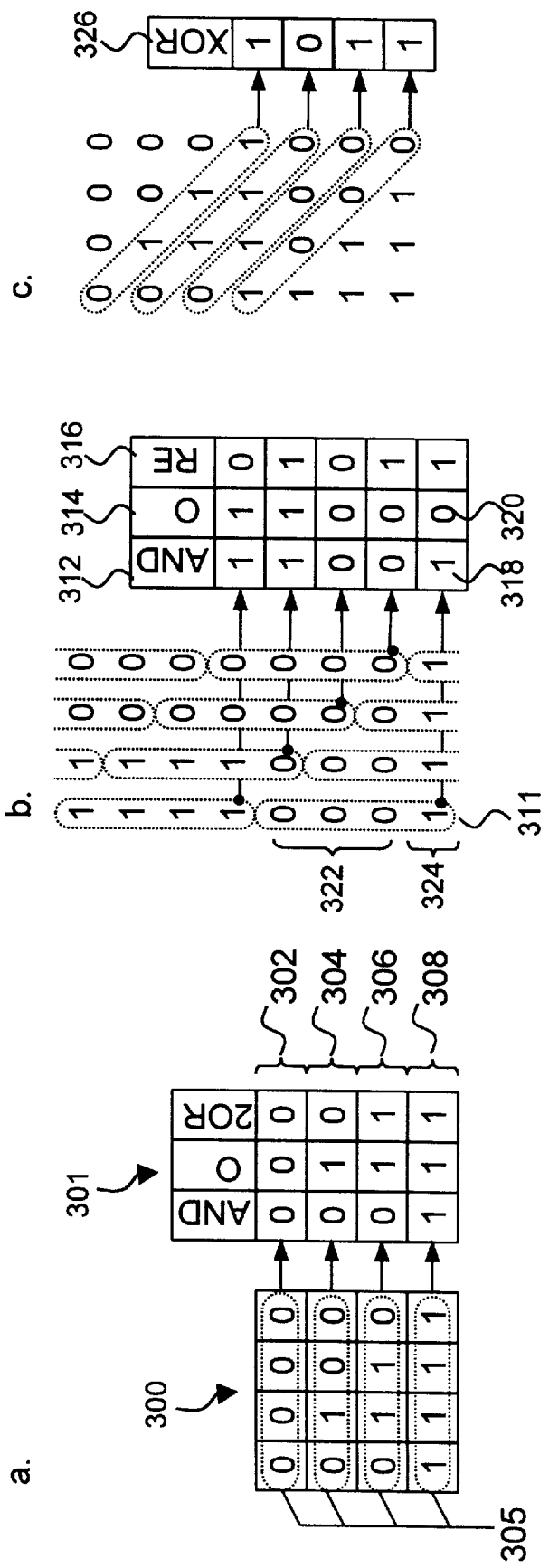
FIG. 3 illustrates an example of a 4-bit wide fail matrix showing row groups, column segment groups and unique groups with corresponding logical operation results tables according to one embodiment of the present invention.

Finally, the fail matrix may be divided into unique groups each containing m elements. Each unique group contains elements that belong to either a consecutive row and a unique column, or a unique row and a consecutive column. FIG. 3-c illustrates a 4-bit wide fail matrix showing binary elements organized into unique groups in the form of diagonals. An exclusive OR ("XOR") operation 326 is applied to each unique group identified within the fail matrix with the results of each operation providing one additional bit of the 6-bit compressed fail vector.

Although a unique group is more easily exemplified by a group of elements organized in a diagonal, it may be more effective to designate the unique group as elements organized in other than a diagonal. The unique group can be designed by creating an m×m template matrix (where m represents the bit-width of the fail vector) and assigning elements to the unique group using the equation: row=(i* col) mod m. In one embodiment, the symbols row and col represent the row and column indices, and the increment value "i" can be determined via a process of elimination as described herein. In one embodiment, the increment value "i" is chosen from a list of candidate values of integers between 1 and m−1. Prior to the selection, integers having a common denominator with m may be eliminated. Furthermore, if increment value "i" is chosen to be "1" or "m−1", the unique group becomes a diagonal as shown in FIG. 3c. Because the unique group is more effective, however, if its elements of adjacent columns are not also in adjacent rows, "1" and "m−1" may be eliminated as candidates for increment value "i". Next, any integer multiple n of block width bw, (n*bw) and m−(n*bw) may be removed as a candidate for increment value "i". Finally, all of (n*bw−1), m−(n*bw−1), (n*bw+1), m−(n*bw+1) are further removed as candidates for increment value "i". The remaining value(s) may then be chosen as the value for increment "i". If, however, prior to completing all the above described steps only a single candidate value remains as the value for increment "i", then the process ends and the remaining value is chosen.

For example, to construct a unique group template for a 16-bit fail vector (where m=16), numbers between 1 and 15 (e.g. between 1 and m−1) are considered, as shown in Table 1.

TABLE 1

|  | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Common Denominator |  | X |  | X |  | X |  | X |  | X |  | X |  | X |  |
| Diagonal | X |  |  |  |  |  |  |  |  |  |  |  |  |  | X |
| n·bw, m−n·bw |  |  |  |  |  |  |  | X |  |  |  |  |  |  |  |
| N·bw−1, n·bw+1, m−(n·bw−1), m+(n·bw−1) | X |  |  |  |  |  | X |  | X |  |  |  |  |  | X |

First, the increment candidates 2, 4, 6, 8, 10, 12, 14 are removed (as marked by X) from the list because they share a common denominator with 16. Additionally, the numbers 1 and 15 may also be eliminated from the list to avoid a diagonal grouping. Assuming a block width that is equal to 8 (bw=8), the following numbers may be eliminated from TABLE 1: 8(bw), 7 (bw−1), 9 (bw+1), 15 (2bw−1), and 1 (m−(2bw−1)). Thus, through the process of elimination, a value for increment "i" may then be selected from the remaining candidate values 3, 5, 11 and 13.

In another example, as illustrated by TABLE 2, a template for a unique group within an 8-bit fail vector having a block width of 4 (bw=4) is constructed.

TABLE 2

|  | 1 | 2 | 3 | 4 | 5 | 6 | 7 |
|---|---|---|---|---|---|---|---|
| Common Denominator |  | X |  | X |  | X |  |
| Diagonal | X |  |  |  |  |  | X |

TABLE 2-continued

|  | 1 | 2 | 3 | 4 | 5 | 6 | 7 |
|---|---|---|---|---|---|---|---|
| N·bw, m−n·bw |  |  |  | X |  |  |  |
| n·bw−1, n·bw+1, m−(n·bw−1), m+(n·bw−1) |  |  | X |  | X |  |  |

Because the fail vector is 9-bits wide, candidate values between 1 and 7 are considered for increment "i". The increment candidates 2, 4 and 6 are eliminated as they share a common denominator with 8, and candidates 1 and 7 are eliminated to avoid a diagonal grouping. With 3 and 5 remaining as candidates of i, either 3 (n·bw−1) or 5 (n·bw+1) may be eliminated, leaving the other candidate as the preferred increment value.

TABLE 3 illustrated the calculation of template matrix coordinates for unique group elements within an 8-bit fail vector (m=8) using an increment value of 3.

TABLE 3

| Column | Calculation | Row |
|---|---|---|
| 0 | (0*3)mod 8 | 0 |
| 1 | (1*3)mod 8 | 3 |
| 2 | (2*3)mod 8 | 6 |
| 3 | (3*3)mod 8 | 1 |
| 4 | (4*3)mod 8 | 4 |
| 5 | (5*3)mod 8 | 7 |
| 6 | (6*3)mod 8 | 2 |
| 7 | (7*3)mod 8 | 5 |

FIG. 11a illustrates a group template constructed from the values contained within TABLE 3. As the template slides vertically across the fail matrix, all the elements that concurrently align with the marked positions of the template are assigned to a single unique group. Using this template, unique groups may be created for the fail matrix, as shown in FIG. 11b where elements with the same letter are assigned to the same unique group.

Hardware Configuration

Figure 4:
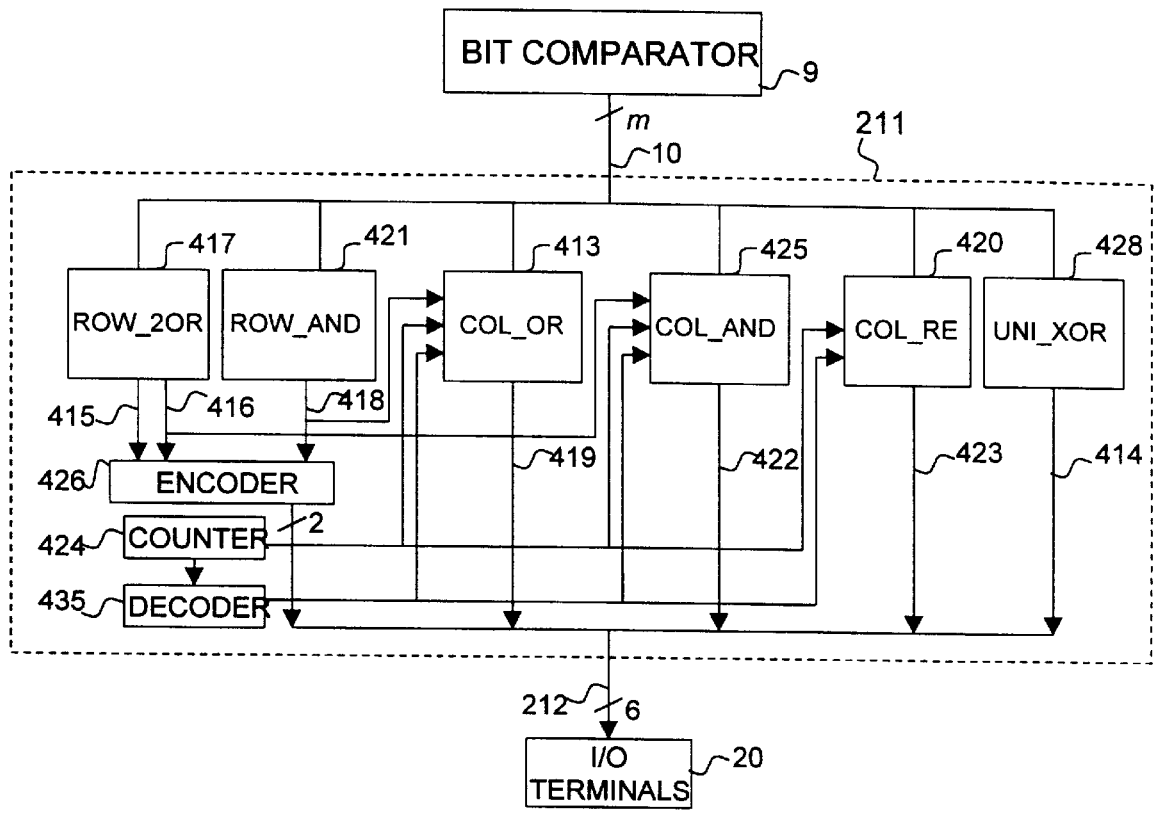
FIG. 4 is a block diagram illustrating compressor circuitry according to one embodiment of the present invention.

FIG. 4 is a block diagram illustrating a compressor 211 according to one embodiment of the present invention. Referring to FIG. 4, the initial fail vector 10 having a variable bit-width (m), is fed from the bit comparator 9 into the compressor 211. The compressor 211 performs a number of logical operations on the initial fail vector 10 that are designed to compress the bit-width of the fail vector into a more manageable compressed fail vector 212. The compressor 211 passes the resulting compressed fail vector 212 to I/O terminals 20 to be output to a location external to the IC. Once out of the IC, the compressed fail vector 212 may then be reconstructed back into the larger initial fail vector 10 for complete memory error diagnosis. In one embodiment, the variable length initial fail vector 10 is compressed into a 6-bit compressed fail vector before being passed to I/O terminals 20 for output.

Referring to FIG. 4, the compressor 211 includes a plurality of logical compression modules including ROW_2OR module 417, ROW_AND module 421, COL_OR module 413, COL_AND module 425, COL_RE module 420, and UNI_XOR module 428. The ROW_2OR module 417 generates the OR operation results 416 and the 2OR operation results 415 of each row group (see for example, results table 301 of FIG. 3a). The ROW_AND module 421 generates the AND operation result 418 of each row group. Results of the ROW_2OR module 417 and the ROW_AND module 421 are fed into a combinatorial encoder 426 to be encoded into a 2-bit representation. Additionally, the OR results 416 of the ROW_2OR module 417 are fed into the COL_AND module 425, and the AND results 418 of the ROW_AND module 421 are fed into the COL_OR module 413. Furthermore, the COL_OR module 413 generates OR results 419, the COL_AND module 425 generates AND results 422, the COL_RE module 420 generates RE results 423, and the UNI_XOR module 428 generates XOR results 414. These various results (419, 422, 423, and 414) are combined with the output of the combinatorial encoder 426 to form a 6-bit compressed fail vector 212 which is passed to I/O terminals 20. In one embodiment, the ROW_AND module 421 is implemented by way of an AND gate having m-input terminals, with each input terminal being connected to one of the mbits of the initial fail vector 10. In one embodiment, the ROW_2OR module 417 is implemented via cascaded logic as shown in FIG. 5.

Figure 5:
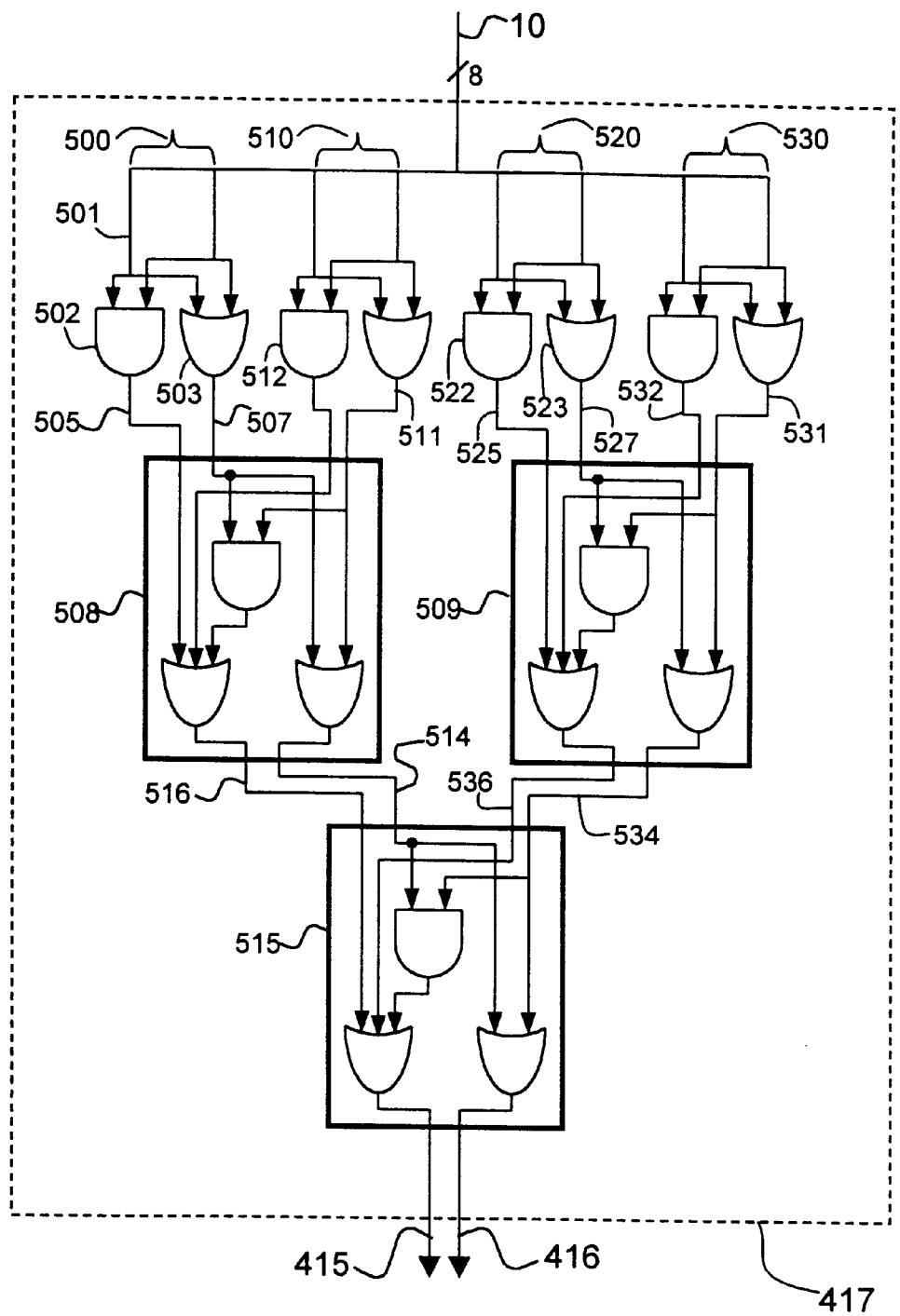
FIG. 5 is a schematic diagram illustrating one embodiment of an 8-bit input ROW_2OR module.

FIG. 5 is a schematic diagram illustrating one embodiment of an 8-bit input ROW_2OR module. Referring to FIG. 5, ROW_2OR module 417 produces both the OR results 416 and 2OR results 415 of each row group, given the initial fail vector 10 as input. In one embodiment, as shown in FIG. 5, the initial fail vector 10 comprises 8-bits that are separated into four bit pairs with each bit pair being connected to a corresponding one of four pairs of logic gates. For example, a first bit 501 of a first bit pair 500 is connected to both an AND gate 502 and an OR gate 503. The OR gate 503 provides OR results 507 while AND gate 502 provides 2OR results 505. Bit pairs 510, 520, and 530 are connected in a similar manner to bit pair 500.

In the exemplary embodiment of FIG. 5, three logic cells (508, 509 and 515) are used to reduce the 8-bit initial fail vector 10 down to two bits, however, it will be apparent to one skilled in the art that the number of logic cells required to reduce the initial fail vector is dependent upon the size of the initial fail vector. Referring to FIG. 5, a first logic cell 508 combines both OR results 507 and 2OR results 505 of a first bit-pair 500, with OR results 511 and the 2OR results 512 of a second bit-pair 510, resulting in first OR cell results 514 and first 2OR cell results 516. Similarly, a second logic cell 509 combines both OR results 527 and 2OR results 525 of a third bit-pair 520, with OR results 531 and 2OR results 532 of a fourth bit-pair 530, resulting in second OR cell results 534 and second 2OR cell results 536. The first OR cell results 514 and the first 2OR cell results 516 are combined with the second OR cell results 534 and the second 2OR cell results 536 to be input into a third logic cell 515. The output terminals of the third logic cell 515 form the ROW_2OR module output terminals (416 and 415).

Figure 6:
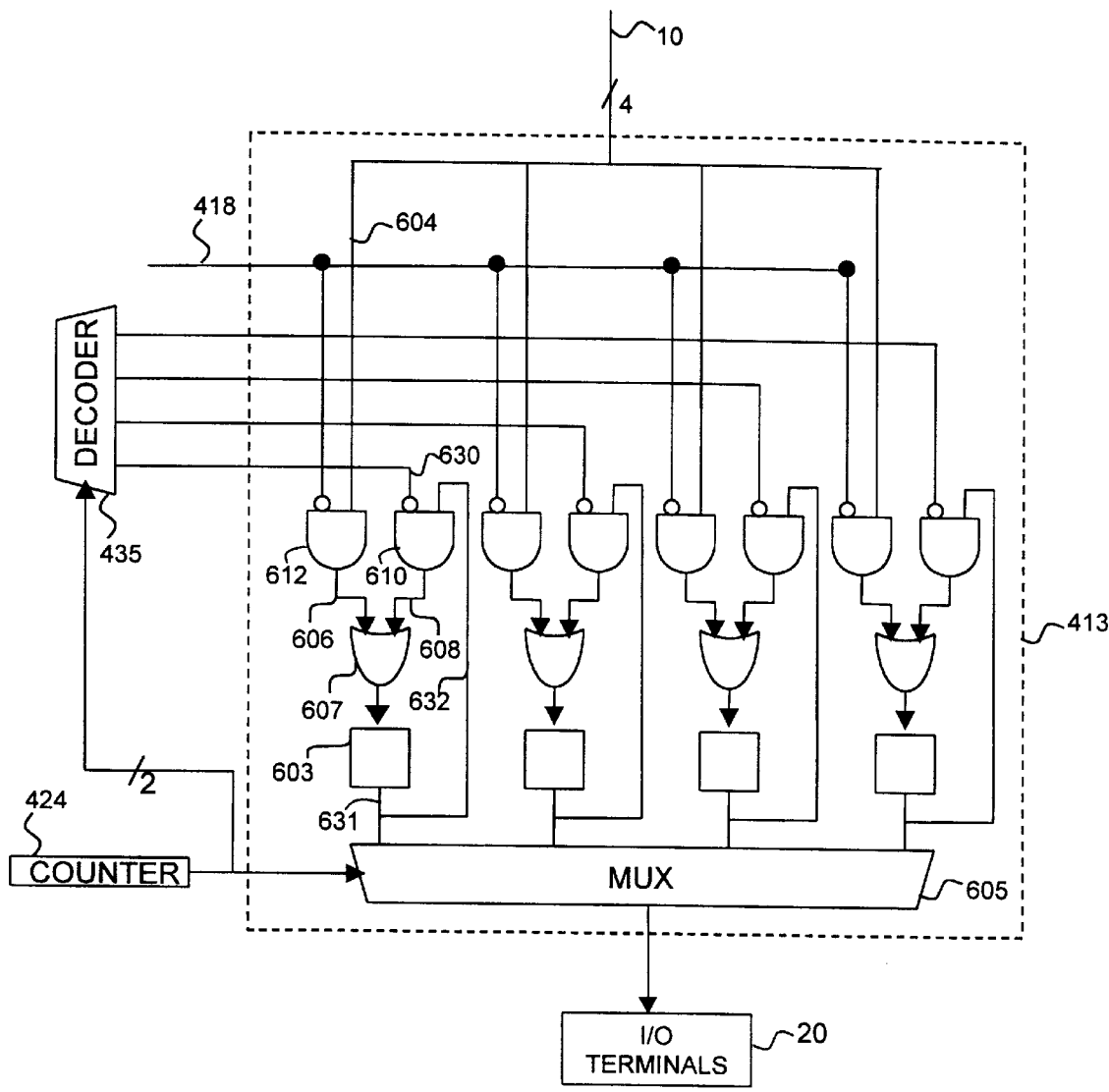
FIG. 6 is a schematic diagram illustrating one embodiment of a 4-bit input COL_OR module.

Referring back to FIG. 4, column modules 413, 425, and 420 are all similarly implemented with respect to each other according to one embodiment of the present invention. In each of the column modules, an accumulating register is used to store the cumulative result of multiple logic operations for each bit of the fail vector 10. A counter 424 and a decoder 435 operate to output and reset the value of the accumulating register every m clock cycles. FIG. 6 is a schematic diagram illustrating one embodiment of a 4-bit input COL_OR module. For each bit-slice, an accumulating register 603 is used to store the cumulative output of the OR gate 607. One input terminal 608 of the OR gate 607 is indirectly connected to the output terminal 631 of the accumulating register 603 through AND gate 610. The other input terminal 606 of the OR gate 607 is indirectly connected to one fail bit 604 of the initial fail vector 10 through AND gate 612. The ROW_AND module result 418 will be a 1 whenever the ROW_AND module 421 (of FIG. 4) operates on a row group containing all 1s. Under such circumstances, each of the fail bits of the COL_OR module 413 are masked to 0s by AND gate 612. Thus, when the result of an AND operation on a row group is 1, the result of an OR operation on an element of the intersecting column is 0 due to masking.

For every m clock cycles, the value of the accumulating register 603 is output to the I/O terminals 20 and then reset to 0. The counter 424 and a multiplexor 605 are used to rotate (i.e. time multiplex) the selection of the bit position to be output to the I/O terminals 20. Since there are m accumulating registers to select from, each accumulating register is selected every m clock cycles. The counter 424 is also coupled to a decoder 435 having m output lines. Each of the output lines of the decoder 435 act to disable each feedback loop from the selected accumulating register of the selected bit position. For example, output line 630 of the decoder 435 acts to disable the feedback loop 632 from the accumulating register 603.

Figure 7:
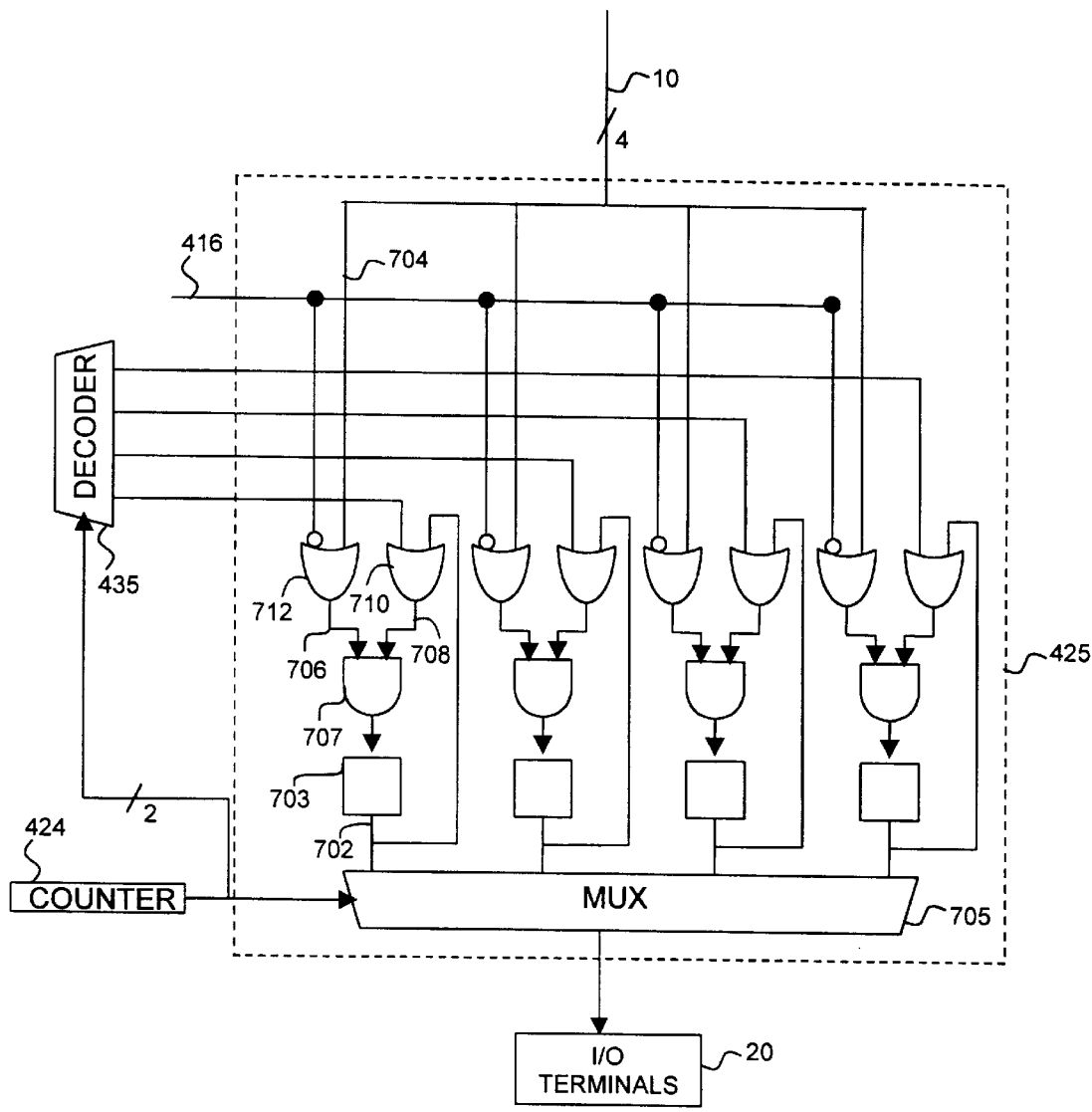
FIG. 7 is a schematic diagram illustrating one embodiment of a 4-bit input COL_AND module.

In one embodiment, the configuration of the COL_AND module 425 is very similar to that of the COL_OR module 413 just described. FIG. 7 is a schematic diagram illustrating one embodiment of a 4-bit input COL_AND module. Each of the fail bits contain two OR gates, an AND gate, and an accumulating register. As each of the four fail bits of the COL_AND module 425 are similarly configured, only one such fail bit 704 is discussed. One input terminal 708 of the AND gate 707 is indirectly connected to the output terminal 702 of the accumulating register 703 through OR gate 710. The other input terminal 706 of the AND gate 707 is indirectly connected to the fail bit 704 of the initial fail vector 10 through OR gate 712. The fail bit 704 is masked to a 1 by the OR result 416 of the ROW_2OR module 417 (of FIG. 4) when the initial fail vector contains all 0s. Every m clock cycles the accumulating register 703 is reset to a 1. The counter 424 and a multiplexor 705 act together to rotate (i.e. time multiplex) the selection of the bit position to be output to I/O terminals 20.

Figure 8:
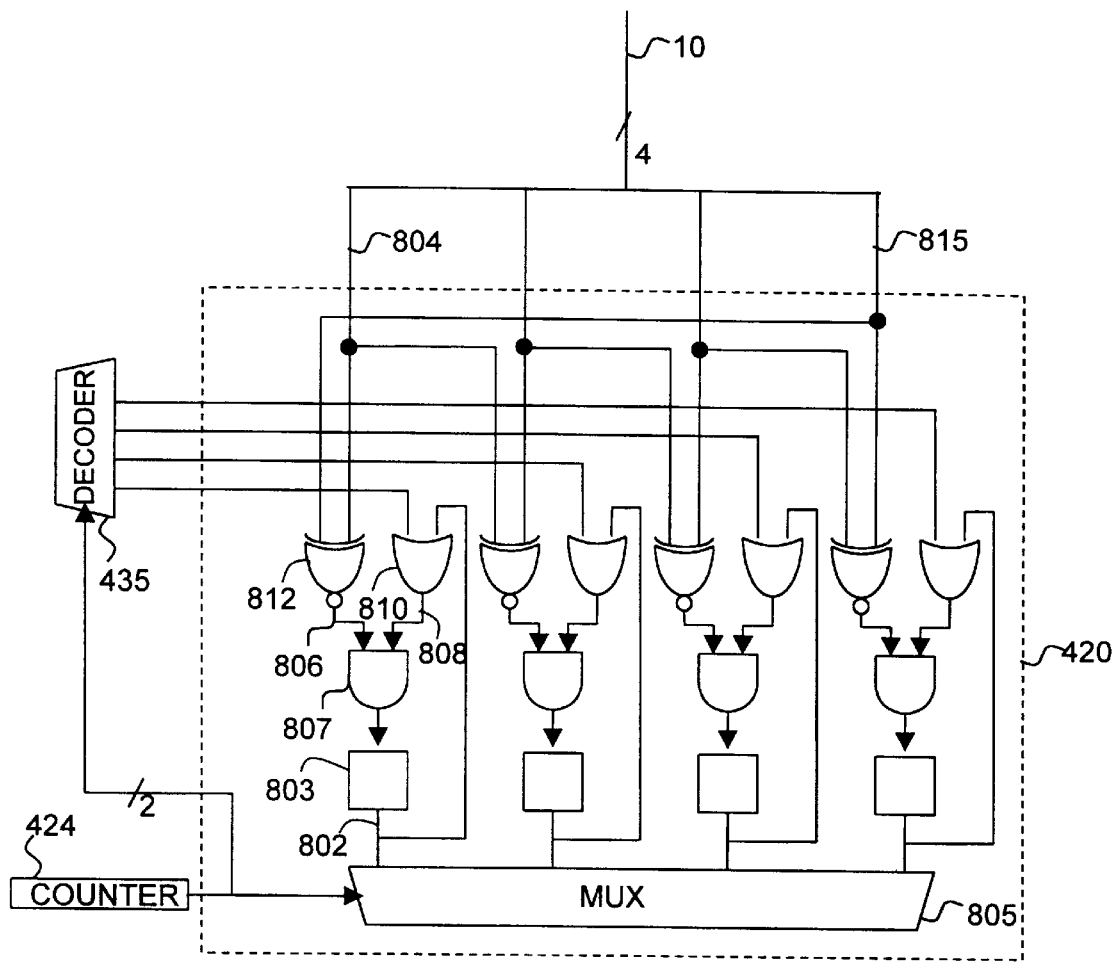
FIG. 8 is a schematic diagram illustrating one embodiment of a 4-bit input COL_RE module.

In one embodiment, the configuration of the COL_RE module 420 is very similar to both the COL_OR module 413 and the COL_AND module 425. FIG. 8 is a schematic diagram illustrating one embodiment of a 4-bit input COL_RE module. For each bit-slice, an accumulating register 803 is used to store the cumulative result of the AND gate 807 for m cycles. One input terminal 808 of an AND gate 807 is indirectly connected to the output terminal 802 of the accumulating register 803 through an OR gate 810. The other input terminal 806 of the AND gate 807, is connected to the output terminal of an exclusive NOR (XNOR) gate 812. Each of the XNOR gates shown in FIG. 8 has one input terminal connected to a corresponding fail-bit and the other input terminal connected to the fail-bit neighboring to the left. Since XNOR gate 812 is connected to the leftmost fail bit, the fail bit neighboring to the left is considered to be the rightmost fail bit 815.

Figure 9:
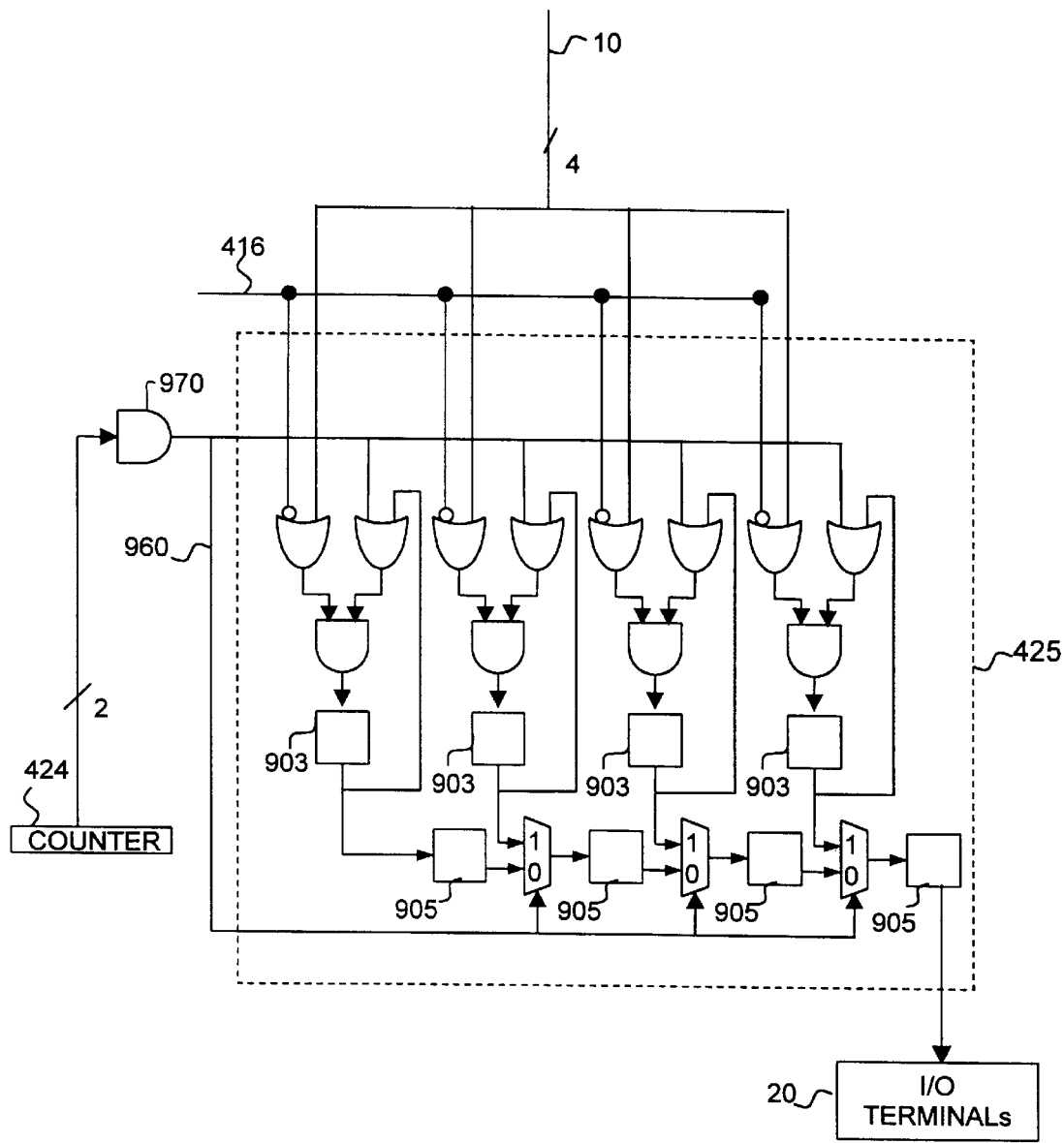
FIG. 9 is a schematic diagram illustrating one alternative embodiment of a 4-bit input COL_AND module.

Each of the column segment group modules described above (e.g. COL_OR 413, COL_AND 425, and COL_RE 420) may also be implemented in various alternative manners. For example, in an alternative embodiment, COL_OR 413, COL_AND 425, and COL_RE 420 may be implemented utilizing a set of shift registers. FIG. 9 is a schematic diagram illustrating an alternative embodiment of the 4-bit input COL_AND module of FIG. 7, however similar implementations could also be utilized for the COL_OR 413 and COL_RE 420 modules. Referring to FIG. 9, instead of utilizing a decoder and a multiplexor to read and reset accumulating register values in a rotational manner, the values in the accumulating registers 903 are copied in parallel to a set of shift registers 905 every m clock cycles. The shift registers 905 act to serially shift the values they contain out to I/O terminals 20. An AND gate 970, having both input terminals tied to the counter 424, is used to detect the state of the counter 424. The output terminal of the AND gate 970 becomes a 1 every m clock cycles thereby loading the shift registers 905 and resetting the accumulating registers 903. Although this configuration does not utilize a decoder and a multiplexor, the additional set of m shift registers 905 may nevertheless consume more circuit area than the previously described embodiment including a decoder and a multiplexor.

Figures 10, 11:
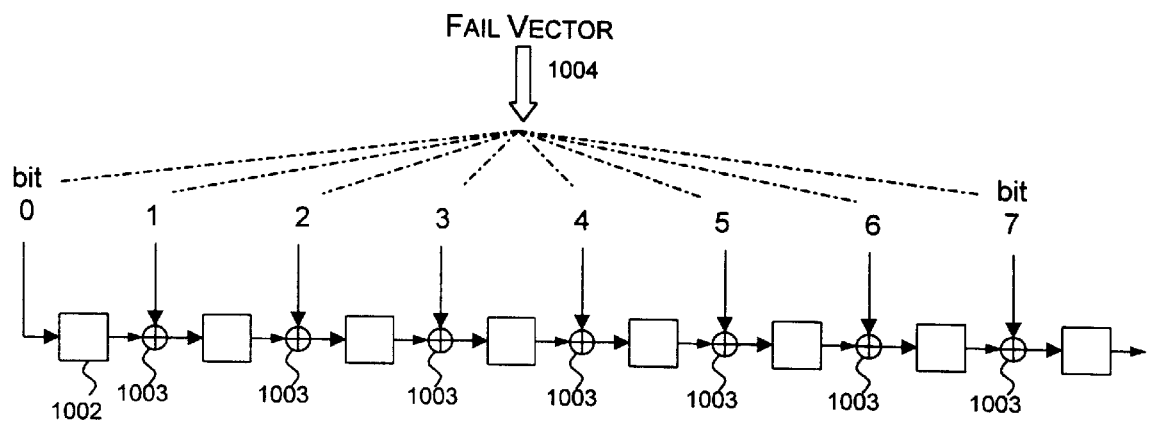
FIG. 10 is a block diagram illustrating one embodiment of an 8-bit UNI_XOR module.
FIG. 11 illustrates unique group assignments according to one embodiment of the present invention.

Referring once again to FIG. 4, according to one embodiment, the UNI_XOR module 428 may be implemented through a chain of m shift registers having m−1 XOR gates interleaved between m registers. FIG. 10 is a block diagram illustrating one embodiment of such an 8-bit UNI_XOR module. Referring to FIG. 10, each of seven XOR gates 1003 is shown having one input terminal connected to a register immediately upstream (i.e. to the left) from the XOR gate, and a second input terminal connected to one bit of the fail vector 1004. Each XOR gate 1003 performs the exclusive OR operation between the applicable upstream register and an associated fail bit value, with the resulting output being fed into the register immediately downstream (i.e. to the right) of the XOR gate 1003. The first bit (bit 0) of the fail vector, is connected directly to the most upstream register 1002 without first passing through an XOR gate 1003.

Fail Vector Reconstruction

In one embodiment, the compressed fail vectors are recorded by one or more devices external to the IC during execution of the test. At the end of the test, the compressed fail vectors are decompressed to form a new matrix containing a plurality of elements having undetermined values. The values of the elements are determined and assigned according to various determination rules described below. In one embodiment, the compressed fail vectors are decompressed by a computer workstation utilizing one or more processors that execute a plurality of instructions stored upon a machine readable medium.

FIG. 12 (a through i) illustrates various determination rules used to recreate an initial fail matrix from a compressed fail matrix according to one embodiment of the present invention. FIGS. 12a and 12b illustrate determination rules for the AND operation. If the result of an AND operation on a group of elements is a 1, then it may safely be assumed that all elements contained within the group are 1s. Conversely, if the result of an AND operation on a group of elements is a 0, it can be assumed that there is at least one 0 present in the group. If the result of an AND operation on a group of m elements is a 0, and m−1 elements have been assigned leaving one element undetermined, a 0 may be assigned to the single undetermined element.

FIGS. 12c and 12d illustrate determination rules for the OR operation. If the result of an OR operation on a group of elements is a 0, then it may be assumed that no is are present within that group. In such a case, all undetermined elements may therefore be assigned a 0. If, however, the OR operation results in a 1, it can only be assumed that at least one 1 is present within the group. If all but one of the elements have been assigned 0s, a 1 may be assigned to the undetermined element.

FIGS. 12e and 12f illustrate determination rules for the 2OR operation. If the result of applying a 2OR function to a group of elements is a 0 (indicating that less than two 1s are present), and one element has been assigned a 1, it can be assumed that no additional 1s are present within the group, and 0s may therefore be assigned to the undetermined elements. If the result of applying a 2OR function to a group of elements is a 1, however, and one element has been assigned a 1, it can be assumed that at least one additional 1 is contained within the group of elements. If one element remains undetermined, a 1 may therefore be assigned to the undetermined element.

FIGS. 12g and 12h illustrate determination rules for the RE operation. As described above, the RE operation is applied to column segment groups to determine whether the elements within a given group are identical to an adjacent group. If the result of applying a RE operation to a group of elements is a 1, then any undetermined elements in either the subject group or its adjacent group are assigned the value of a corresponding determined element in the opposite group. If the result of applying a RE function to a group of elements is a 0, 2m−1 elements have been assigned values in both the subject group and its adjacent group, and m−1 neighboring pairs are identical, then the undetermined element in the subject group may be assigned the inverse of its corresponding element in the adjacent group (see FIG. 12h). Lastly, FIG. 12i illustrates determination rules for the XOR operation. If an XOR function is applied to a group of elements, and only 1 element of this group has not been assigned, a two-step determination is made. First, the determined elements of the group are XOR'd with each other. Second the result of the XOR operation is then XOR'd with the XOR result generated by the compressor. The undetermined element is then assigned the result of the final XOR operation (see FIG. 12i).

Each of the determination rules described above is associated with both dependent values and assignment values. For example, if the AND result of a group is a 0 and only one element of the group remains undetermined, the determination of that one element in the group depends on m−1 elements being 1s to assign a 0 to the undetermined element (see FIG. 12b). In such a case, the dependent value is said to be a 1 and the assignment value is said to be a 0. Some determination rules, however, do not have dependent values. TABLE 4 summarizes the dependent values and assignment values for each determination rule described herein. Determination rules with dependent values are called dependent determination rules, whereas those without dependent values are referred to as independent determination rules.

TABLE 4

| Determination Rule | Dependent Value(s) | Assignment Value(s) |
| --- | --- | --- |
| AND = 1 | NONE | 1 |
| AND = 0 | 1 | 0 |
| OR = 0 | NONE | 0 |
| OR = 1 | 0 | 1 |
| 2OR = 0 | 1 | 0 |
| 2OR = 1 | BOTH | 1 |
| RE = 0 | BOTH | BOTH |
| RE = 1 | BOTH | BOTH |
| XOR | BOTH | BOTH |

When a determination rule is applied to a group, it is referred to as a determination task. In one embodiment, the compression scheme described herein contains thirteen determination tasks, as shown in TABLE 5. A determination task that is associated with an independent determination rule is referred to as an independent determination task, whereas a determination task that is associated with a dependent determination rule is referred to as a dependent determination task. The first four tasks listed in TABLE 5 (AND=1 and OR=0) are independent determination tasks.

TABLE 5

| Index | Rule | Group |
| --- | --- | --- |
| 1 | AND = 1 | Rows |
| 2 | OR = 0 | Rows |
| 3 | AND = 1 | Column segments |
| 4 | OR = 0 | Column segments |
| 5 | 2OR = 0 | Rows |
| 6 | RE = 1 | Column segments |
| 7 | AND = 0 | Rows |
| 8 | OR = 1 | Rows |
| 9 | AND = 0 | Column segments |
| 10 | OR = 1 | Column segments |
| 11 | 2OR = 1 | Rows |
| 12 | RE = 0 | Column segments |
| 13 | XOR | Unique Group |

Figure 13:
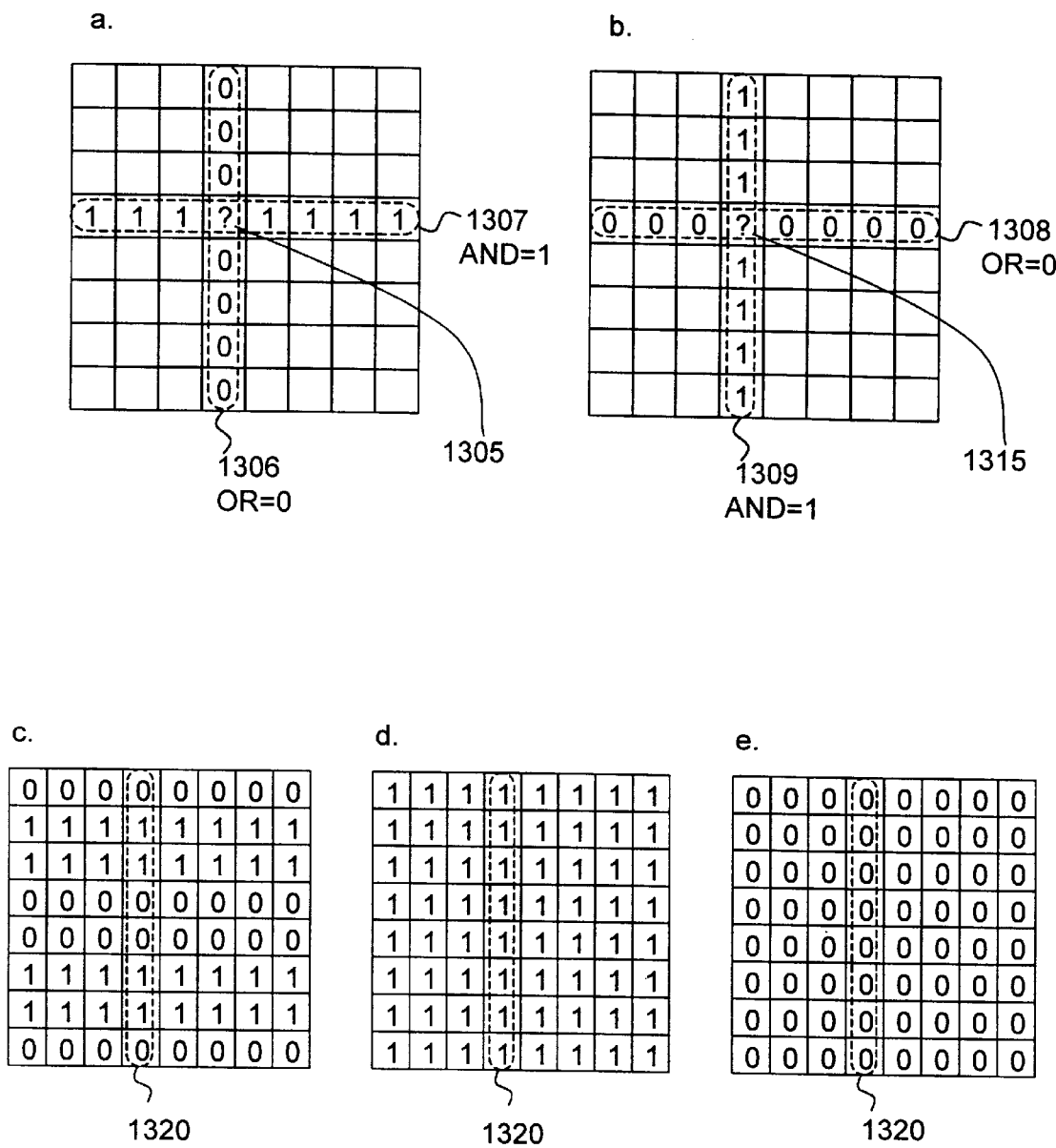
FIG. 13 illustrates various determination conflicts that may arise during reconstruction of the initial fail matrix.

Each new value that is assigned to an undetermined element may in turn enable the determination of another undetermined element. Thus, determination tasks are reiterated until new determinations are no longer possible. In one embodiment, the order by which determination tasks are performed is restricted to reduce potential conflicts caused by masking. FIG. 13 illustrates various determination conflicts that may arise during reconstruction of the initial fail matrix.

First, the results of an AND operation performed on a row group may conflict with the results of an OR operation performed on a column segment group. As shown in FIG. 3a, if the AND function of a row group 1307 results in a 1, all undetermined elements of the row assigned 1s according to one determination rule. When an OR operation performed on an intersecting column segment group 1306 results in a 0 (due to masking during compression), however, all undetermined elements in the column segment group are assigned 0s according to another determination rule. The two functions therefore act to assign different values to the same undetermined element 1305 at the intersection of the column segment group and the row group.

Another conflicting scenario is shown in FIG. 13b, where the result of the OR operation of the row group 1308 is a 0, indicative a row of all 0s, and the result of the AND operation of the column segment 1309 is a 1, indicative a column segment of all 1s. Again, according to two seemingly conflicting determination rules, two different values are to be assigned to the same undetermined element 1315 at the intersection of the column segment group 1309 and the row group 1308.

In both types of conflicts, due to masking, the row group determination results in the correct value of the intersecting element, but the column segment group determines an incorrect value of the intersecting element. Because the determination rules involved happen to be independent, values generated from independent determinations of column segment groups should not overwrite values already assigned by independent determinations of row groups. Values generated from independent determinations of row groups, however, may overwrite values already assigned by independent determinations of column segment groups.

In the third conflict type, the AND and OR operations performed by the same column segment group may contradict each other such that the AND operation results in a 1

(indicating all elements are 1s), but the OR operation results a 0 (indicating no elements are 1s). As shown in FIG. 13c, this occurs when every row that crosses a column segment group 1320 is either a row of all 1s or a row of all 0s. A row of all 0s is masked as a row of all 1s for the AND function of the column segment group 1320 (see FIG. 13d). Conversely, a row of all 1s is masked as a row of all 0s for the OR operation of the column segment group 1320 (See FIG. 13e). Thus, the AND operation is really applied to a group of 1 s, whereas the OR operation is applied to a group of 0s.

This conflict may also be resolved by restricting values determined by independent determinations of columns from overwriting assigned elements. That is, the elements in one or more column segment groups may be determined through the determination of rows that intersect a given column. As long as row independent tasks are executed before column independent tasks, this contradicting output combination (column AND=1 and OR=0), does not provide any information useful for decompression and may therefore be eliminated as possible permutations of the compressed fail vector via combinatorial logic. For example, in one embodiment when column segments result in a 1 for an AND operation and a 0 for an OR operation, the output is mapped to any of the three other possible combinations (AND, OR=00, 01, 11). Because the contradicting output will not appear as a compressed fail vector, the output may be utilized for other purposes such as, for example use within signal mode to indicate the status of memory test execution.

In one embodiment, decompression is performed by executing all independent tasks first. Counters are utilized to keep track of the number of 0s, 1s and undetermined elements, of row groups, column segment groups, and unique groups. When an assignment is made to an undetermined element, all the groups that contain this element are checked for possible dependent determination tasks that may be executed. In one embodiment, the dependent determination tasks may be identified and queued while updating the counters for the various groups. The decompression is complete either when all elements have been assigned a value or all dependent determination tasks have been executed.

For most determination rules, the condition for determination is based on the numbers of 0s, 1s, and undetermined elements in a group. A significant amount of processing time may be consumed by visiting every element of a group to count 0s, 1s and undetermined elements. Therefore, in one embodiment, processing time is reduced by employing counters to keep track of the number of 0s, 1 s, and undetermined elements. In one embodiment, counters that count the number of zeros (num_zero), the number of ones (num_one), and the number of unknowns (num_x) are used for each row group, column segment group, and unique group within the fail matrix. In another embodiment, only two of the three counters are used since the third counter value may be calculated from the other two counter values.

In one embodiment, two additional counters representing the number of 1 s masked to 0s by the row AND operation (num_mask_and), and the number of 0s masked to 1s by the row OR operation (num_mask_or) are used in conjunction with each column segment group. The extra counters are utilized because the numbers of 0s and 1s assigned may not be the same as the numbers of 0s and 1s used to generate the results of the AND and OR operations due to masking.

During reconstruction of the initial fail matrix, independent determination tasks of row groups should proceed before those of the column segment groups. If instead, the independent determination tasks of column segment groups are executed first, many of the values determined may be incorrect due to masking, which will need to be overwritten with the correct values determined from the rows. On the other hand, if the independent determination tasks of row groups are executed first, they alone may be sufficient to reconstruct the initial fail matrix, thereby reducing processing time.

Figure 14:
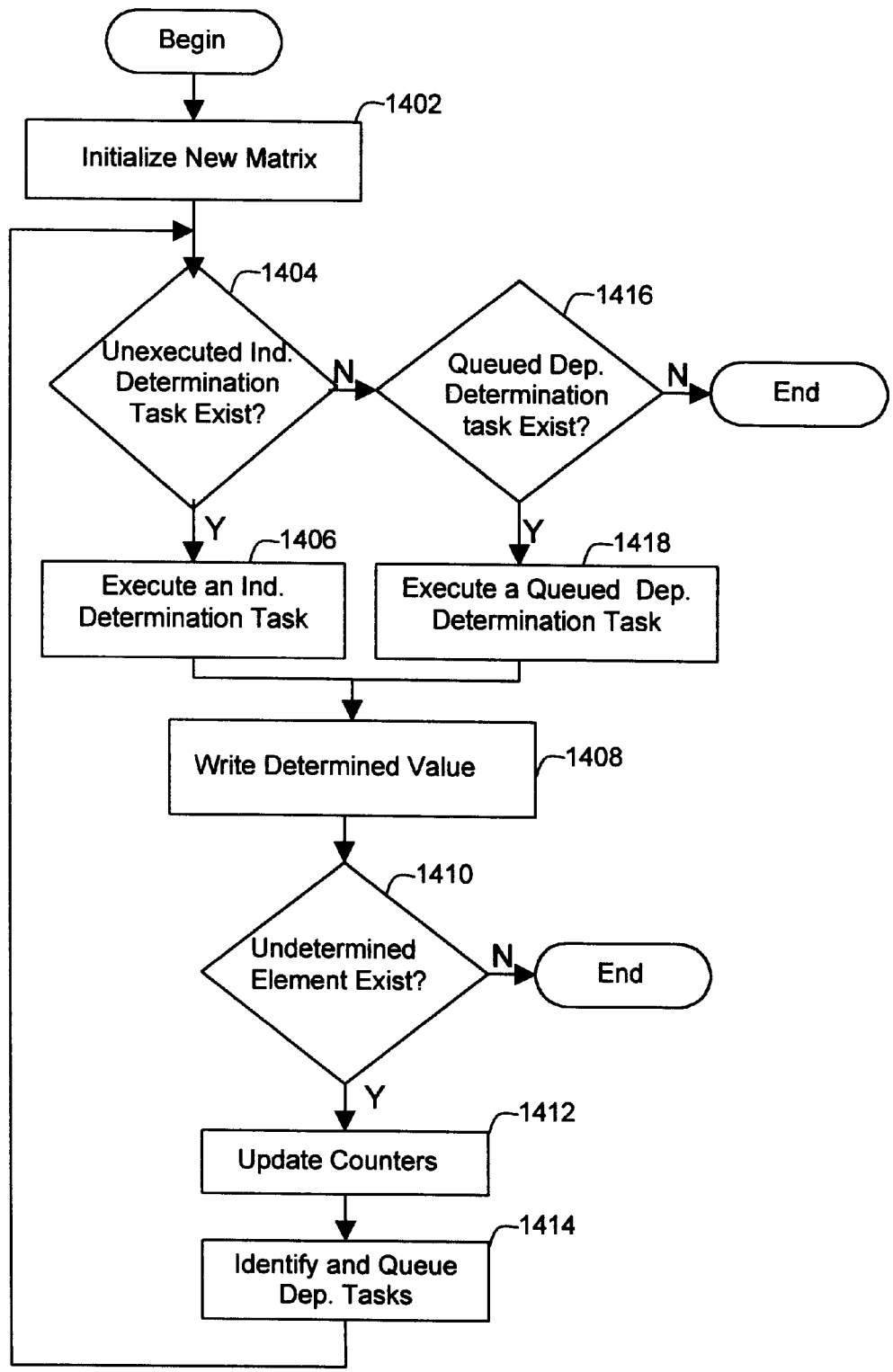
FIG. 14 is a flow diagram illustrating reconstruction of an initial fail matrix according to one embodiment.

FIG. 14 is a flow diagram illustrating reconstruction of an initial fail matrix according to one embodiment of the present invention. Upon initiating reconstruction, the system first constructs a new matrix having the same dimensions as the initial fail matrix and initializes each element within the new matrix to have a value of "undetermined" (1402). Once the matrix is created, the system checks for the existence of independent determination tasks (1404). If an independent determination task exists (1404), the independent determination task is executed (1406). Recall that the independent determination tasks for row groups include the tasks associated with an OR=0 result and an AND=1 result. Each of these tasks may be executed together in parallel or separately. If the two tasks are executed separately, the determination task of OR=0 should be executed first for two reasons. First, since most elements of a fail matrix tend to be 0 s, OR=0 may determine more elements. Second, in the special case where no faults were detected by the RAM test, the decompression may be completed within a single pass since 0s will be assigned to all elements.

Once the value of an undetermined element is ascertained through the execution of an independent determination task, the value is assigned to the element (1408). Next, the system identifies whether additional elements with undetermined values remain within the matrix (1410). In one embodiment, if elements with undetermined values remain only in a few regions of the matrix, windows may be created to enclose those regions such that additional determination tasks may be performed within the created windows rather than the entire matrix. As undetermined elements are assigned values, the size of the windows may shrink or become partitioned. The process ends when all elements have been assigned value. If, however, additional elements with unassigned values remain, then the counters of intersecting groups containing the last element to be assigned value are updated (1412). Additional dependent determination tasks that may now be satisfied based upon the determination of the element are identified and queued (1414) for execution after all independent determination tasks have been executed. If additional independent determination tasks remain to be executed (1404), the process repeats itself. Remaining independent determination tasks may include tasks of columns. Both independent determination tasks of columns may be executed in one pass or separately in two passes. If the two tasks are executed separately, the determination of OR=0 should be executed before AND=1, as OR=0 may determine more elements than AND=1. If, however, no unexecuted independent determination tasks remain (1404), a determination is made as to whether any queued dependent determination tasks exist (1416). If no queued determination tasks exist, the process ends. If however, at least one queued determination task exists, the queued task is executed (1418) and the determined value is assigned to the element (1408). The decompression process ends if no dependent determination tasks remain (1416) or if all elements within the matrix have been assigned values (1410).

In addition to those embodiments described above, various other configurations may likewise be implemented. For example, depending upon the fault pattern involved, both the pin count and circuit area necessary for the apparatus described herein may be reduced if just a subset of the compression modules are utilized. Similarly, the number of necessary I/O terminals may be reduced by increasing the various group sizes within the fail matrix and time multiplexing the resulting outputs according to the size increase.

Column segment groups may be modified to include a greater number of elements without a significant decrease in compression quality. Likewise, row and unique groups may also be modified to include a greater number of elements. For example, rather than each AND, OR and RE operation being performed on a single row, the operations may be performed on multiple consecutive rows. Likewise, the XOR operation may be based on multiple consecutive unique groups rather than a single unique group.

Rather than the output of the bit comparator being compressed, the output of the memory may bypass the bit-comparator and be connected directly to input terminals of the compressor. Elimination of the bit comparator removes the ability of the BIST circuit to identify whether the memory under test contains faults or not, but reduces the circuit area. As the result, the compression quality may decrease for some fault patterns.

When multiple memories embedded on the same chip are tested serially, the compression hardware needs no modification. Conversely, the compression hardware may be modified in several ways to accommodate multiple memories tested in parallel. Each memory may have its own compression hardware. As the result, area and pin count for diagnosis increases with each additional RAM.

FIG. 15 is a block diagram illustrating a compressor connected to parallel memories according to one embodiment of the present invention. The compressor 211 views multiple memories, such as RAMs 100 and 102, tested in parallel as a single memory. The data output from the two memories (111,112), having bit-widths of size m and n respectively, are input into the bit comparator 9. The bit comparator 9 generates a combined fail vector 113 having a bit-width of m+n. For each combined fail vector 113, a six-bit compressed fail vector 114 is generated. This method, although preventing the addition of pins, may require as much circuit area as if each RAM had its own compressor. The compression quality may decrease, however, if faults appearing in both memories are less than m+n addresses apart.

Yet another design to accommodate the parallel testing of multiple memories involves the superimposition of the fail vectors from the memories. FIG. 16 is a block diagram illustrating the use of superimposition to connect two bit-comparators 115, 116 to a single compressor according to one embodiment of the present invention. Referring to FIG. 16, fail bits of the same bit-positions are fed into an array of OR gates 124. The output terminals of the OR gate array 122 are connected to the input terminals of the compressor. For explanation purposes, assume that the first bit-comparator 115 outputs a fail vector having a bit-width (m) that is larger than the bit-width (n) of the fail vector output by the second bit-comparator 116. The fail-bits representing the difference between the two fail vectors (e.g. m−n) are directly connected to the compressor. Although such a superimposed fail vector configuration will indicate the row and column of a faulty bit given multiple memories, it typically will not indicate which memory (i.e. RAM) the fault originates from. To compensate for this, and thus distinguish the failing RAM, the fail vectors from bit comparator 115 and 116 are fed into OR gates 118 and 117 respectively, with the output of the OR gates being passed to the I/O terminals. This method reduces the circuit area overhead, but may increase the routing area depending on the locations of the RAMs.

Whereas many alterations and modifications of the present invention will no doubt become apparent to a person of ordinary skill in the art after having read the foregoing description, it is to be understood that any particular embodiment shown and described by way of illustration is no way intended to be considered limiting. Therefore, references to details of various embodiments are not intended to limit the scope of the claims which in themselves recite only those features regarded as essential to the invention.

What is claimed is:

1. In an integrated circuit having embedded memory, a method for testing said embedded memory comprising:

generating test data and applying said test data to said embedded memory;

comparing actual responsive outputs of said embedded memory with expected responsive outputs to form a plurality of initial fail vectors; and compressing the initial fail vectors to form compressed failed vectors by performing a plurality of logical operations on logical groups of elements of a fail matrix logically formed from said initial fail vectors, said compressing comprising:

routing data elements of said initial fail vectors to a plurality of logical operation circuitry in accordance with said data elements' logical group memberships in said logical groupings of elements of said fail matrix, and performing said logical operations on said logically grouped data elements of said initial fail vectors using said logical operation circuitry.

2. The method of claim 1, wherein each of the fail vectors logically forms a row of the fail matrix.

3. The method of claim 2, wherein each data element of an initial fail vector belongs to at least two types of logical groups.

4. The method of claim 2, wherein said logical groups include at least one of row groups, column segment groups, and diagonal groups.

5. The method of claim 4, wherein each diagonal group includes elements of said fail matrix logically occupying a consecutive row and a consecutive column of said fail matrix.

6. The method of claim 4, wherein said logical operations performed on each row group include at least an AND operation, an OR operation, and a 2OR operation, with the results forming at least a portion of a compressed fail vector.

7. The method of claim 4, wherein said logical operations performed on each column segment group include at least an AND operation, an OR operation, and a RE operation, with the results forming at least a portion of a compressed fail vector.

8. The method of claim 4, wherein said logical operation performed on each diagonal group includes at least an XOR operation which results to form at least a portion of a compressed fail vector.

9. The method of claim 1, wherein said compressing further comprises concatenating results of different logical operations performed on different logical groups of elements of said fail matrix.

10. A method comprising:

receiving a plurality of compressed fail vectors, each having a plurality of representations formed in accordance with results of logical operations performed on logically grouped elements of a fail matrix formed from a plurality of initial fail vectors; and recovering said initial fail vectors by successively ascertaining values of data elements of said fail matrix by successively examining said representations and applying a plurality of determination rules specifying assignment values for said data elements of said fail matrix in accordance with at least the results of said logical operations.

11. The method of claim 10, wherein said successive applications of determination rules comprise applying a plurality of independent determination rules specifying assignment values for said data elements of said fail matrix in accordance with said results of the logical operations, and group types of said logical groups on which said logical operations were performed.

12. The method of claim 10, wherein said successive applications of determination rules comprise applying a plurality of dependent determination rules specifying assignment values for said data elements of said fail matrix in accordance with at least said results of said logical operations and one or more dependent values.

13. The method of claim 10, wherein said successive ascertaining of values of said data elements of said fail matrix further comprises at least inherent resolution of conflicting assignment values specified by different determination rules for a data element of the fail matrix.

14. The method of claim 13, wherein said inherent resolution of conflicting assignment values comprises applying a first determination rule for a result of a first logical operation performed on a logical group of a first group type, before applying a second determination rule for a result of a second logical operation performed on a logical group of a second group type.

15. An article of manufacture comprising:

a recordable medium having recorded thereon a plurality of programming instructions for use to program a computing device to enable the computing device to be able to receive a plurality of compressed fail vectors, each having a plurality of representations formed in accordance with results of logical operations performed on logically grouped elements of a fail matrix formed from a plurality of initial fail vectors, and to recover said initial fail vectors by successively ascertaining values of said data elements of said fail matrix by successively examining said representations and applying a plurality of determination rules specifying assignment values for said data elements of said fail matrix in accordance with at least said results of said logical operations.

16. The article of manufacture of claim 15, wherein said programming instructions further enable the computing device to apply a plurality of independent determination rules specifying assignment values for said data elements of said fail matrix in accordance with said results of the logical operations, and group types of said logical groups on which said logical operations were performed.

17. The article of manufacture of claim 15, wherein said programming instructions further enable said computing device to apply a plurality of dependent determination rules specifying assignment values for said data elements of said fail matrix in accordance with at least said results of the logical operations and one or more dependent values.

18. The article of manufacture of claim 15, wherein said programming instructions further enable said computing device to at least inherently resolve conflicting assignment values specified by different determination rules for a data element of said fail matrix.

19. The article of manufacture of claim 18, wherein said programming instructions enable the computing device to apply a first determination rule for a result of a first logical operation performed on a logical group of a first group type, before applying a second determination rule for a result of a second logical operation performed on a logical group of a second group type.

20. An integrated circuit comprising:

a comparator to successively generate a sequence of comparison outputs;

a plurality of logical operation circuits, said plurality of logical operation circuits comprising an AND operation circuit and an OR operation circuit; and a plurality of couplings coupling a plurality of combinations of data elements of said sequence of comparison outputs to said logical operation circuits to perform a plurality of logical operations on said combinations of data elements to compress said comparison outputs, said plurality of couplings coupling said combinations of data elements to said logical operation circuits as logical groups of data elements of a logical data matrix formed from said sequence of comparison outputs, said plurality of couplings comprising couplings coupling combinations of data elements of said sequence of comparison outputs that are members of row groups of said logical data matrix to said AND and OR operation circuits to AND and OR the coupled combinations of data elements.

21. An integrated circuit comprising:

a comparator to successively generate a sequence of comparison outputs;

a plurality of logical operation circuits, said plurality of logical operation circuits comprising an AND operation circuit and a 2OR operation circuit; and a plurality of couplings coupling a plurality of combinations of data elements of said sequence of comparison outputs to said logical operation circuits to perform a plurality of logical operations on said combinations of data elements to compress said comparison outputs, said plurality of couplings coupling said combinations of data elements to said logical operation circuits as logical groups of data elements of a logical data matrix formed from said sequence of comparison outputs, said plurality of couplings comprising couplings coupling combinations of data elements of said sequence of comparison outputs that are members of row groups of said logical data matrix to said AND and 2OR operation circuits to AND and 2OR the coupled combinations of data elements.

22. An integrated circuit comprising:

a comparator to successively generate a sequence of comparison outputs;

a plurality of logical operation circuits, said plurality of logical operation circuits comprising an OR operation circuit and a 2OR operation circuit; and a plurality of couplings coupling a plurality of combinations of data elements of said sequence of comparison outputs to said logical operation circuits to perform a plurality of logical operations on said combinations of data elements to compress said comparison outputs, said plurality of couplings coupling said combinations of data elements to said logical operation circuits as logical groups of data elements of a logical data matrix formed from said sequence of comparison outputs, said plurality of couplings comprising couplings coupling combinations of data elements of said sequence of comparison outputs that are members of row groups of said logical data matrix to said OR and 2OR operation circuits to OR and 2OR said coupled combinations of data elements.

23. An integrated circuit comprising:

a comparator to successively generate a sequence of comparison outputs;

a plurality of logical operation circuits, said plurality of logical operation circuits comprising an AND operation circuit and a OR operation circuit; and a plurality of couplings coupling a plurality of combinations of data elements of said sequence of comparison outputs to said logical operation circuits to perform a plurality of logical operations on said combinations of data elements to compress said comparison outputs, said plurality of couplings coupling said combinations of data elements to said logical operation circuits as logical groups of data elements of a logical data matrix formed from said sequence of comparison outputs, said plurality of couplings comprising couplings couplings coupling combinations of data elements of said sequence of comparison outputs that are members of column segment groups of said logical data matrix to said AND and OR operation circuits to AND and OR the coupled combinations of data elements.

24. An integrated circuit comprising:

a comparator to successively generate a sequence of comparison outputs;

a plurality of logical operation circuits, said plurality of logical operation circuits comprising an AND operation circuit and a RE operation circuit; and a plurality of couplings coupling a plurality of combinations of data elements of said sequence of comparison outputs to said logical operation circuits to perform a plurality of logical operations on said combinations of data elements to compress said comparison outputs, said plurality of couplings coupling said combinations of data elements to said logical operation circuits as logical groups of data elements of a logical data matrix formed from said sequence of comparison outputs, said plurality of couplings comprising couplings coupling combinations of data elements of said sequence of comparison outputs that are members of column segment groups of said logical data matrix to said AND and RE operation circuits to AND and RE said coupled combinations of data elements.

25. An integrated circuit comprising:

a comparator to successively generate a sequence of comparison outputs;

a plurality of logical operation circuits, said plurality of logical operation circuits comprising an XOR operation circuit; and a plurality of couplings coupling a plurality of combinations of data elements of said sequence of comparison outputs to said logical operation circuits to perform a plurality of logical operations on said combinations of data elements to compress said comparison outputs, said plurality of couplings coupling said combinations of data elements to said logical operation circuits as logical groups of data elements of a logical data matrix formed from said sequence of comparison outputs, said plurality of couplings comprising couplings coupling combinations of data elements of said sequence of comparison outputs that are members of diagonal groups of said logical data matrix to said XOR operation circuits to XOR the coupled combinations of data elements.

26. An integrated circuit comprising:

a comparator to successively generate a sequence of comparison outputs;

a plurality of logical operation circuits, said plurality of logical operation circuits comprising an AND operation circuit and an OR operation circuit;

a plurality of couplings coupling a plurality of combinations of data elements of said sequence of comparison outputs to said logical operation circuits to perform a plurality of logical operations on said combinations of data elements to compress said comparison outputs, said plurality of couplings coupling said combinations of data elements to said logical operation circuits as logical groups of data elements of a logical data matrix formed from said sequence of comparison outputs, said plurality of couplings comprising couplings coupling combinations of data elements of said sequence of comparison outputs that are members of row groups of said logical data matrix to said AND and OR operation circuits to AND and OR the coupled combinations of data elements;

embedded memory coupled to said comparator; and test circuitry coupled to said embedded memory and said comparator to successively apply test data to said embedded memory and to successively provide expected responsive outputs to said comparator for use by said comparator to generate said sequence comparison outputs with said successively provided expected responsive outputs, and actual responsive outputs of said embedded memory.

* * * * *